United States Patent [19]
Anacher et al.

[11] 3,733,526
[45] May 15, 1973

[54] LEAD ALLOY JOSEPHSON JUNCTION DEVICES

[75] Inventors: Wilhelm Anacher, Yorktown Heights; Kurt R. Grebe, Beacon; James H. Greiner, Millwood; Syamal K. Lahiri, Croton-on-Hudson; Kyu C. Park, Yorktown Heights; Hans H. Zappe, Granite Springs, all of N.Y.

[73] Assignee: International Business Machines Corporation, Armonk, N.Y.

[22] Filed: Dec. 31, 1970

[21] Appl. No.: 103,236

[52] U.S. Cl. .........317/234 R, 317/234 S, 317/234 T, 331/107 S, 307/306, 307/245

[51] Int. Cl. .................................................H01l 3/10

[58] Field of Search .......................317/234 S, 234 T; 331/107 S; 307/306, 245

[56] References Cited

UNITED STATES PATENTS

| | | | |
|---|---|---|---|
| 3,394,317 | 7/1968 | Graever | 330/62 |
| 3,370,210 | 2/1968 | Fiske | 317/235 |

OTHER PUBLICATIONS

Taylor, Journal of Applied Physics, Vol. 39 No. 6, May 1968, pp. 2498–2499.

Lumpkin, IBM Tech. Discl. Bull., Vol. 10, No. 5.

*Primary Examiner*—Martin H. Edlow
*Attorney*—Hanifin & Jancin; Jackson E. Stanland

[57] ABSTRACT

A superconducting Josephson junction tunnel device having in particular lead alloy electrodes (Pb-In and Pb-In-Sn) and a very precisely defined and dense tunnel barrier comprising an oxide of the lead alloy electrode. Such devices can be thermally cycled between liquid helium temperatures and room temperatures, and provide large tunnelling currents.

12 Claims, 3 Drawing Figures

INVENTORS
WILHELM ANACKER
KURT R. GREBE
JAMES H. GREINER
SYAMAL K. LAHIRI
KYU C. PARK
HANS H. ZAPPE

BY J. E. [signature]
AGENT

LEAD ALLOY JOSEPHSON JUNCTION DEVICES

CROSS REFERENCE TO RELATED APPLICATIONS

Ser. No. 889,100, filed Dec. 30, 1969 and assigned to the present assignee, describes reduction of hillock growth in thin films by the use of alloy additions. Ser. No. 103,088, filed Dec. 31, 1970 now abandoned and assigned to the present assignee describes the use of intermetallic compounds to suppress hillock growth in Josephson junction devices.

BACKGROUND OF THE INVENTION

1. Field of the Invention

This invention relates to superconducting Josephson tunneling devices, and in particular to a superconducting tunnel device having electrodes of lead and indium, or lead and indium-tin.

2. Description of the Prior Art

Superconducting tunnel devices are known, as can be seen by referring to J. Matisoo, "The Tunneling Cryotron-A Superconductive Logic Element Based on Electron Tunneling," *Proceedings of IEEE*, Vol. 55, No. 2, February, 1967, pp. 172–180; U. S. Pat. No. 3,370,210, and U. S. Pat. No. 3,423,607. In particular, superconducting tunnel devices which exhibit a Josephson current are taught by these references. This type of current was first discovered by B.D. Josephson and is described in a paper set forth in *Physics Letters*, Vol. 1, page 251 (July 1962). Since that time, many attempts have been made to fabricate good Josephson devices which can be thermally cycled over large temperature ranges and which exhibit high tunnelling current. However, these attempts have met with shortcomings since it is extremely difficult to obtain a good tunnel barrier having a thickness as small as 2–50 Angstroms, which is the thickness of the tunnel barrier that is needed for Josephson devices. In order to obtain a good Josephson device, the tunnel barrier must be within this thickness range and must be very dense and uniform in thickness. A high density barrier minimizes the possibility of an electrical short across the junction and a uniform thickness throughout the barrier area means that uniform tunnelling currents will exist throughout the tunnelling junction area.

In particular, lead has been used as an electrode material for superconducting tunnelling devices, including Josephson tunnelling devices. Lead is a desirable material because it has good superconducting properties, including a fairly high transition temperature (7°K). In fabricating tunnel devices using lead, a first layer of lead is deposited, after which this layer is oxidized and then a second layer of lead is deposited over the oxidized layer, for use as a counter electrode. The use of lead as an electrode material has disadvantages, however. One of these disadvantages is that very thin lead oxide layers are difficult to form since the lead oxidizes rapidly and the film produced is often too thick to be suitable as a tunnel barrier.

In order to obtain good tunnelling devices using lead electrodes, it has been reported that photomasking techniques are more suitable than evaporation mask techniques for device fabrication. J. P. Pritchard, W. H. Schroen, "Superconductive Tunneling Device Characteristics for Array Application," *IEEE Trans. on Magnetics*, Vol. MAG-4, No. 3, September 1968, p. 320. However, our studies have indicated that Josephson tunnelling devices using lead electrodes do not have good tunnelling barriers when photomasking techniques are used instead of evaporation mask techniques. The devices so produced have the same shortcomings as those lead electrode tunnel devices mentioned previously. That is, lead electrode tunnel devices cannot be thermally cycled over large temperature ranges, and such devices have inferior tunnel barriers.

Accordingly, it is a primary object of this invention to provide improved superconducting tunnelling devices having large tunnelling currents.

Another object of this invention is to provide a superconductive tunnelling device having large tunnelling current and high thermal cycling capability.

Still another object of this invention is to provide an improved superconductive device exhibiting Josephson tunnelling, said device having high Josephson tunnel currents and improved stability when thermally cycled between liquid helium temperatures and room temperatures.

SUMMARY OF THE INVENTION

In order to provide a superconductive Josephson tunnelling device having good thermal cycling capability and higher tunnelling currents, a device has been fabricated using lead alloy electrodes having a preferred composition. Specifically, pure lead films are replaced by lead-indium alloy films, or lead-indium-tin alloy films. The indium and/or indium-tin exist throughout the lead films.

The use of these particular materials yields a tunnel device in which an improved oxide barrier is obtained. That is, if an oxide is grown on the alloy electrode, it will be found that reduced oxidation rates result. This means that the thickness of the oxide film can be extremely small, which is a necessity for good tunnelling barriers. Further, the oxide film has a smaller limiting thickness, in contrast with oxide films grown on pure lead films. The oxide films are extremely dense and uniform, which provides very low tunnelling resistance. Another advantage is that this tunnelling device can be thermally cycled between liquid helium temperatures and room temperatures without inordinate device destruction.

Although lead alloy films have been proposed previously, (Ser. No. 889,100 filed Dec. 30, 1969 and assigned to present assignee), those alloy films did not use the particular composition set forth herein and the use of an alloy was for a different purpose. In that application, it was not realized that oxidation rates .nd oxidation quality could be controlled by utilizing particular compositions as electrode materials. Lead-indium and lead-tin superconductors are known in the art, as can be seen by reference to U. S. Pat. No. 3,394,317. This patent does not describe Josephson junction devices, but rather describes amplifiers, D. C. transformers, etc. which use superconductive elements and voltage inducement between these elements.

Another reference, U. S. Pat. No. 3,391,024, describes the improved bonding of lead onto substrates through the use of an underlying indium-tim alloy layer. Here, there is no inclusion of the indium and tin into the lead and no tunnel barrier and counter electrode are provided, since a tunneling device is not described. Despite the large amount of work in the prior art to make superconductive tunnelling devices having large tunnelling currents and the diverse directions taken by the prior art in order to provide good tunnelling devices, the use of lead-indium and lead-indium-tin electrode alloys to provide tunnel devices having superior tunnel barriers was never mentioned or suggested. By precise experimentation and analysis, applicants have discovered that lead can be used as an electrode material in an improved tunnelling device if it is conditioned in a particular way, as set forth above.

The foregoing and other objects, features and advantages of this invention will be apparent from the following more particular description of the preferred embodiments of the invention as illustrated in the accompanying drawings.

DESCRIPTION OF THE PREFERRED EMBODIMENT

Figure 1:
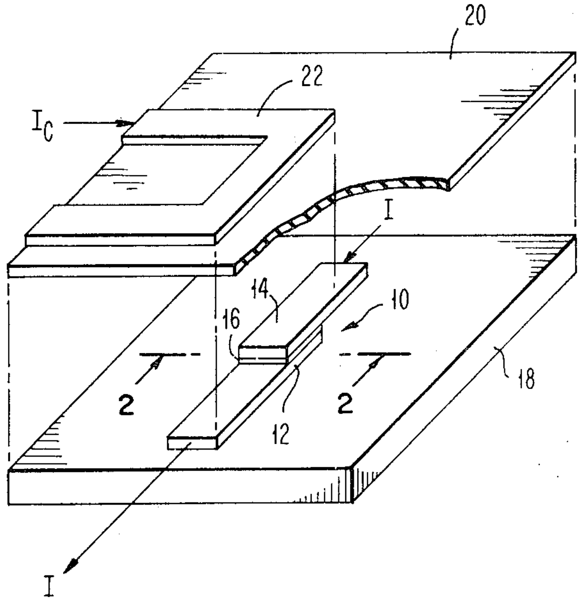
FIG. 1 shows a Josephson junction device having a control line thereover for controlling the critical Josephson current through the device.

A basic thin film Josephson junction device 10 is shown in FIG. 1. Device 10 is comprised of superconducting electrodes 12 and 14, separated by a tunnel barrier 16, which is usually an oxide of the base electrode 12. The device 10 is located on a substrate 18, which could be glass, quartz, or other suitable material. Reference to Ser. No. 875,615, filed Nov. 12, 1969 and assigned to the present assignee lists many suitable substrate materials, as well as many tunneling barriers. Insulating layer 20 electrically isolates superconductive control line 22 from the device 10.

Current I from a current source (not shown) passes through the tunneling junction comprising electrodes 12 and 14 as well as tunnel barrier 16. The maximum Josephson current which can exist at zero voltage across the junction is determined by many factors, as is well known in the art. The control line 22 has a control current $I_c$ flowing therethrough which establishes a magnetic field through the tunnel junction thereby affecting the magnitude of the maximum Josephson current $I_{MAX}$ through the junction.

Numerous materials have been proposed for the electrodes of the Josephson device, including both type I and type II superconductive materials. However, a suitable Josephson tunneling device is not easy to obtain since the device requires many different criteria, as listed here:

1. Stability during repeated thermal cycling.
2. High maximum Josephson current.
3. Low tunneling resistance.
4. Controllable and uniform oxidation (tunnel barrier) characteristics and,
5. No transformation (material property changes) during storage or cycling.

This invention proposes the use of specific lead alloys for the electrodes 12 and 14 of the Josephson junction device 10. Consequently, in FIG. 2, the electrodes 12 and 14 in the region of the junction are comprised of alloy materials. The tunnel barrier is generally an oxide of the alloy electrode 12. Specifically, the alloys suitable for electrode materials are lead-indium and lead-indium-tin.

Figure 2:
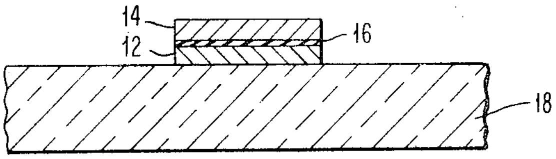
FIG. 2 is a cross-sectional view taken through line 2—2 of FIG. 1, showing only the superconducting electrodes and the tunnel barrier of the device of FIG. 1.

In FIG. 2, the insulating layer 20 and overlying control line 22 are not shown, although they may or may not be present depending upon the particular application. The substrate 18 provides support for the Josephson device 10 having electrodes 12 and 14 and a tunnel barrier 16 therebetween.

Figure 3:
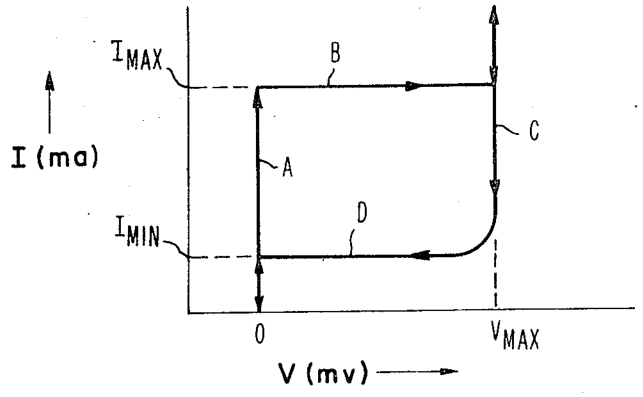
FIG. 3 is a crurent versus voltage plot for a Josephson junction device.

A current versus voltage plot for a Josephson junction is shown in FIG. 3. The zero voltage state of a Josephson device is a pair tunneling state, while the high voltage state is a single particle tunneling state. Josephson current exists at zero voltage if the tunnel barrier 16 is of the order of 2–50 angstroms. This is the thickness of the actual potential barrier through which electron pairs must tunnel in order to establish Josephson current.

Josephson current can increase until a critical current $I_{MAX}$ is reached. Thus portion A of the curve is traced. When the critical current $I_{MAX}$ is reached, the Josephson device rapidly switches along curve B to a high voltage state having a voltage $V_{MAX}$. The transition from a voltage $V_{MAX}$ to zero voltage for decreasing current occurs at a current $I_{MIN}$ which is somewhat less than $I_{MAX}$, producing a hysteresis effect. The current versus voltage plot follows curves C and D for decreasing voltage from $V_{MAX}$.

Method of Fabrication

Base Electrode

The base electrode 12 is a lead alloy comprising lead and indium, or lead and indium-tin. It is desirable that the indium or indium-tin impurities diffuse into the lead to create an alloy electrode. One method of achieving this is to deposit a layer of indium or indium-tin onto the substrate 18, after which a layer of lead is deposited over the underlayer of indium or indium-tin. These depositions are at room temperature, and the underlayer material (either indium or indium-tin) diffuses into the lead to provide a lead alloy electrode.

In more detail, an indium or indium-tin layer of approximately 500A. is deposited on substrate 18. The thickness of the underlying tin or indium-tin layer depends upon the amount of doping desired in the final electrode. Typically, doping up to approximately 10 percent will provide suitable devices. Since indium has a lower critical temperature than lead, it is generally desirable to limit the amount of indium in the lead, since the superconducting properties of the electrode will be adversely affected. After deposition of the indium or indium-tin underlayer, a layer of lead i evaporated. This layer is approximately 1,000–10,000A. in thickness and is usually around 4,000 to 5000A. thick. The underlying indium or tin-indium layer will be approximately 100–500A. thick. Both the deposition of the underlying layer and the lead layer can be done at room temperature, although depositions at slightly higher temperatures (100°–125°C will provide suitable alloy electrodes. Deposition at these higher substrate temperatures will speed up the homogeneity process by which dopants are uniformly distributed in the lead layer.

If the underlying layer is indium-tin, these materials are usually approximately evenly divided in percentage. That is, the indium-tin underlayer is comprised of approximately 50% indium and 50% tin. However, the percentages are variable, 50–100% tin w/remainder indium, or 50–100% indium w/remainder tin, being suitable.

Tunnel Barrier

The tunnel barrier is grown on the underlying base electrode by conventional methods, such as thermal oxidation or plasma oxidation. Because of the nature of the underlying lead alloy electrode, extremely good tunnel barriers are created. These barriers are of uniformly controlled thickness and are dense and tightly adherent to the base electrode.

If thermal oxidation is used, oxygen is introduced in the vacuum chamber used for the base electrode depositions and approximately 16 hours to one day is used to grow an oxide of approximately 10–50 angstroms on the base electrodes. This thermal oxidation is done at room temperature up to a temperature of approximately 40°C. The oxidation rate increases as the temperature increases, although it is not desirable to increase the thermal oxidation temperature too greatly, as hillocks may grow on the lead alloy electrode.

The presence of the lead alloy base electrode slows the oxidation rate considerably when compared to the oxidation rate on pure lead films. A superior oxide is formed having a different form than that obtained on pure lead electrodes. The oxide has a very uniform thickness and for an array of Josephson devices will have very well controlled thickness in each device. This increases the reliability of arrays of these devices. Also, the lead alloy electrode has improved yield strength and stronger grain boundaries, which help to minimize the thermal cycling problems which develop during actual use of the devices.

Counter Electrode

The counter electrode 14 is also lead. The same vacuum chamber is used, after the oxygen atmosphere is pumped out. If desired, the lead source for evaporation is heated to a higher temperature than that used during the actual deposition in order to outgas the lead melt. If not done, source spitting may result. During the outgassing, the structure comprising the base lead alloy and its overlying tunnel barrier (as well as the substrate) is covered with a shutter. After this, the source temperature is lowered and the deposition rate is monitored until it reaches the desired value. At this time, the shutter is moved away from the substrate and a layer of lead of approximately 4000A. is deposited on the tunnel barrier.

Control Electrode and Insulation

If desired, insulation such as $SiO_2$ can be evaporated onto the counter electrode, after which a control electrode is deposited through a mask (or by other convenient means) onto the insulating layer. Any superconductor will be suitable as the control electrode 22. Another method is to grow an oxide (greater than 50A.) on the lead counter electrode before depositing the control electrode.

As an alternative, a coating of photoresist or other suitable insulating material can be placed over the counter electrode, if the control electrode is not used. This insulating coating will help the stability of the device during temperature cycling.

Development of a device having an indium or indium-tin doped lead counter electrode has not been completed so it is difficult to assess this type of symmetrical device. However, the use of the same lead alloy in both the base electrode and the counter electrode may be advantageous.

Lead and Indium-Tin Device

While the above description primarily describes indium underlayers, the following will be a brief discussion of the use of indium-tin underlayers.

The indium-tin underlayer is provided by depositing indium onto the substrate 18 followed by a deposition of tin onto the indium layer. Evaporation is suitable for these deposition steps and the total indium-tin thickness will be approximately that of the single indium layer previously described. If desired, tin can be first deposited, followed by indium. As another alternative, indium and tin can be co-evaporated to make a layer approximately 100–500A., corresponding to lead layers of 1,000–10,000A.

The lead layer is then deposited over the indium-tin layers to a thickness generally about 4,000A. The indium-tin and lead evaporations are at approximately room temperature so that the indium and tin will diffuse into the lead to create an alloy. Although a percentage of indium or indium-tin in the lead alloy growth is generally below 10 percent, it is possible to use 1–25 weight percent of indium or indium-tin in the lead electrode. Typically the weight percentage of indium or indium-tin in the lead layer is 6 percent. As was stated previously, the superconducting properties of the lead alloy electrode are the determining factors in selecting the percentage of alloy additions desired. If too much indium or indium-tin is used, the transition temperature will be too low for suitable Josephson devices.

The rest of the fabrication steps, i.e., provision of the tunnel barrier 16 and counter electrode 14, are the same as those described previously in the fabrication of a Josephson junction having a lead-indium base electrode 12.

Josephson junction devices having these particular lead alloy electrodes are very advantageous over conventional Josephson junction devices. One advantage relates to the very well controlled thickness of the tunnel barrier in each device. This feature is very important when fabricating arrays of Josephson junction devices, since it is important that all devices in the array have approximately the same critical Josephson current $I_{MAX}$. If this criterion is not met, the various devices will not switch at the same current and voltage levels, leading to unreliability of the array.

By use of this invention, it has been discovered that the tunnel barrier thickness of each device is very well controlled to within small tolerance variations. Therefore, arrays produced with these devices are very reliable.

Another advantage relates to the fact that very thin tunnel barriers can be provided, which are dense and uniform. Since thin tunnel barriers can be obtained, smaller devices can be made having the same maximum Josephson currents $I_{MAX}$. These smaller devices have smaller capacitance and are therefore faster.

Another advantage relates to the slower oxidation rate which occurs especially when plasma oxidation is used to provide the tunnel barrier. The oxide barriers produced are continuous and of uniform thickness. Even at very thin oxide levels, the oxide barriers are short-free and contain no pinholes.

Josephson junction devices having these lead alloy electrodes also show improved stability with repeated thermal cycling. That is, these films show improved hillock resistance when thermally cycled. The use of these lead alloy electrodes increases the resistance to dislocation movements (line defects) in the electrodes. The alloy additions also increase the frictional force between grain boundaries thereby increasing the resistance to grain boundary movements and diffusion creep. Since the oxide barriers produced are extremely adherent, increased device stability is obtained. The alloy additions increase the yield point at which dislocation movements take place, thereby aiding mechanical stability. Stress relaxation is minimized and the junctions remain stable when continually thermally cycled.

In addition, low tunneling resistance results due to the improved oxide barriers.

What has been shown is an improved Josephson junction device having lead alloy electrodes. Because lead is a generally desirable material from the standpoint of superconductive properties, the invention is important in making this material useful, even though it has a relatively poor yield strength. Specifically, these lead alloy electrodes overcome the disadvantages of poor oxide tunnel barriers and hillock formation when the devices are thermalloy cycled.

What is claimed is:

1. A superconductive tunneling device capable of supporting Josephson tunneling current therethrough, comprising:

a first superconducting electrode comprised of lead and indium, where said indium is present in said first electrode in an amount 1–25 weight percent of said electrode, a second superconducting electrode, a tunnel barrier sufficiently thin to allow Josephson tunneling current therethrough located between said first and second electrodes, said tunnel barrier being comprised of an insulating layer having compounds of lead and indium therein.

2. The device of claim 1, where said insulating layer is comprised of an oxide having lead and indium therein.

3. The device of claim 1, where said first electrode also includes tin and said tunnel barrier has compounds of tin therein.

4. The device of claim 3, wherein the combination of tin and indium in said first electrode comprises about 1–25 weight percent of said at least one electrode.

5. The device of claim 1, where indium is also present in said second electrode.

6. The device of claim 1, where said indium is distributed throughout said first electrode.

7. The device of claim 1, further including a control line insulated from said first and second electrodes for carrying current which establishes a magnetic field coupling said Josephson tunneling device.

8. The device of claim 1, where said first electrode is comprised of at least 90 weight percent lead.

9. The device of claim 3, where said tin and indium are present in substantially equal amounts.

10. The device of claim 1, where said first superconducting electrode is 1,000–10,000 A. thick.

11. A superconductive tunneling device capable of supporting Josephson tunneling current therethrough, comprising:

a first superconducting electrode comprised of lead and indium, where said indium is present in said first electrode in an amount less than 10% by weight of said electrode, a second superconducting electrode, a tunnel barrier sufficiently thin to allow Josephson tunneling current therethrough located between said first and second electrodes, said tunnel barrier being an oxide of lead and indium.

12. The device of claim 11 wherein said first electrode additionally comprises tin and said barrier additionally contains an oxide of tin.

* * * * *